(12) United States Patent
Park et al.

(10) Patent No.: US 10,782,810 B2
(45) Date of Patent: Sep. 22, 2020

(54) GATE DRIVING CIRCUIT AND DISPLAY DEVICE COMPRISING THE SAME

(71) Applicant: LG Display Co., Ltd., Seoul (KR)

(72) Inventors: ChanSoo Park, Goyang-si (KR); SeEung Lee, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 213 days.

(21) Appl. No.: 16/126,237

(22) Filed: Sep. 10, 2018

(65) Prior Publication Data

US 2019/0139508 A1  May 9, 2019

(30) Foreign Application Priority Data

Nov. 8, 2017  (KR) .......................... 10-2017-0148373

(51) Int. Cl.
| | | |
|---|---|---|
| *G06F 3/041* | (2006.01) | |
| *G06F 3/044* | (2006.01) | |
| *G09G 3/36* | (2006.01) | |

(52) U.S. Cl.
CPC ............ *G06F 3/0412* (2013.01); *G06F 3/044* (2013.01); *G06F 3/04164* (2019.05); *G06F 3/04166* (2019.05); *G09G 3/3677* (2013.01); *G09G 2310/0286* (2013.01)

(58) Field of Classification Search
CPC ......... G09G 2310/0286; G09G 3/3266; G09G 3/3674–3681
See application file for complete search history.

(56) References Cited

U.S. PATENT DOCUMENTS

| | | | | |
|---|---|---|---|---|
| 9,024,913 | B1 | 5/2015 | Jung et al. | |
| 9,477,345 | B2* | 10/2016 | Moon | G06F 3/0412 |
| 10,204,694 | B2* | 2/2019 | Zhao | G11C 19/18 |
| 10,248,239 | B2* | 4/2019 | So | G02F 1/13338 |

(Continued)

FOREIGN PATENT DOCUMENTS

| | | |
|---|---|---|
| JP | 2015210811 A | 11/2015 |
| JP | 2016105590 A | 6/2016 |
| KR | 10-2016-0094835 A | 8/2016 |

OTHER PUBLICATIONS

Notice of Reasons for Rejection dated Sep. 3, 2019, from the Japanese Intellectual Property Office in counterpart Japanese Application No. 2018-168271.

(Continued)

*Primary Examiner* — Patrick F Marinelli
(74) *Attorney, Agent, or Firm* — Morgan, Lewis & Bockius LLP

(57) ABSTRACT

A gate driving circuit includes a plurality of stages sequentially connected to one another. The plurality of stages each includes an output unit for outputting a first clock signal as a gate output voltage in response to a voltage of a Q node and a voltage of a QB node; a first node controller configured to charge the voltage of the Q node in response to the gate output voltage from a previous stage; a second node controller configured to charge the voltage of the QB node in response to a second clock signal having a different phase from the first clock signal; a first node stabilizer configured to block a leakage current path of the Q node when the second clock signal is not applied; and a second node stabilizer configured to block a leakage current path of the QB node when the second clock signal is not applied.

11 Claims, 6 Drawing Sheets

(56) References Cited

U.S. PATENT DOCUMENTS

| | | | |
|---|---|---|---|
| 10,268,306 B2* | 4/2019 | Gu | G06F 3/0416 |
| 10,339,887 B1* | 7/2019 | Hong | G09G 3/3677 |
| 2015/0043703 A1 | 2/2015 | Tan et al. | |
| 2015/0346904 A1* | 12/2015 | Long | G09G 3/3677 |
| | | | 345/174 |
| 2016/0149573 A1 | 5/2016 | Maehashi et al. | |
| 2016/0224175 A1* | 8/2016 | Moon | G06F 3/0412 |
| 2016/0266699 A1* | 9/2016 | Zhao | G09G 3/3677 |
| 2017/0199617 A1* | 7/2017 | Gu | G06F 3/0416 |
| 2017/0269769 A1* | 9/2017 | Hu | G09G 3/20 |
| 2018/0004329 A1* | 1/2018 | So | G02F 1/13338 |
| 2018/0268914 A1* | 9/2018 | Zhao | G11C 19/18 |
| 2019/0066604 A1* | 2/2019 | Kong | G09G 3/3291 |
| 2019/0129547 A1* | 5/2019 | Dai | G06F 3/0412 |
| 2019/0130847 A1* | 5/2019 | Um | G09G 3/3291 |
| 2019/0139508 A1* | 5/2019 | Park | G06F 3/04166 |
| 2019/0155433 A1* | 5/2019 | Park | G06F 3/0443 |
| 2019/0163001 A1* | 5/2019 | Gong | G02F 1/13338 |
| 2019/0164514 A1* | 5/2019 | Gong | G06F 3/0412 |
| 2019/0180708 A1* | 6/2019 | Hong | G09G 3/3677 |
| 2019/0189052 A1* | 6/2019 | Moon | G09G 3/3233 |

OTHER PUBLICATIONS

Combined Search and Examination Report dated May 8, 2019, from the United Kingdom Intellectual Property Office in counterpart application No. 1818213.9.

* cited by examiner

GATE DRIVING CIRCUIT AND DISPLAY DEVICE COMPRISING THE SAME

CROSS-REFERENCE TO RELATED APPLICATIONS

This application claims the benefit of Korean Patent Application No. 10-2017-0148373 filed in Korea on Nov. 8, 2017, which is hereby incorporated by reference in its entirety.

BACKGROUND

Technical Field

The present disclosure relates to a display device, and more particularly, to a gate driving circuit implemented as a gate-in-panel (GIP) circuit and a display device including the same.

Description of the Background

Recently, as information society advances, the display field involving the visual representation of electrical information is rapidly developing. In accordance with this rapid development, various display devices having excellent performance such as reduced thickness, light weight, and low power consumption properties have been developed. Examples of such display devices may include a liquid crystal display device (LCD), an organic light emitting display device (OLED), and the like.

A display device may include a display panel, on which pixel arrays for displaying an image are disposed, and driving circuits. The driving circuits may include a data driving circuit configured to supply a data signal to data lines disposed on the display panel, a gate driving circuit configured to sequentially supply a gate pulse to gate lines disposed in an active area of the display panel, and a timing controller configured to control the data driving circuit and the gate driving circuit.

The gate driving circuit of these driving circuits has recently been implemented as a gate-in-panel (hereinafter, referred to as "GIP") circuit embedded in the display panel with the pixel arrays.

The GIP includes a shift register configured to sequentially output a gate voltage, and the shift register includes a plurality of stages dependently connected to one another.

The stages of the shift register include a Q node, which charges the gate lines, a QB node, which discharges the gate lines, and a switching circuit connected to the Q node and the QB node. The switching circuit charges the Q node in response to a start pulse or an output from a previous stage to cause a voltage of the gate lines to rise, and discharges the QB node in response to an output or a reset pulse from a next stage.

In recent years, display devices have been breaking away from more traditional input systems, such as a button, a keyboard, and a mouse, and have often adopted a touch screen, which allows a user to intuitively and conveniently input information or commands. A touch screen is an input device that may be installed in an image display device and enables a user to input predetermined information by applying a pressure to a touch sensor within the touch screen while viewing the image display device.

Touch screens may be classified into add-on type, on-cell type, and in-cell type according to their structure. Particularly, in-cell type touch screens are being widely used because they are suitable for display devices with reduced thickness and improved durability.

SUMMARY

Accordingly, the present disclosure is directed to a gate driving circuit and display device comprising the same that substantially obviate one or more of the problems due to limitations and disadvantages of the related art.

An object of the present disclosure is to provide a gate driving circuit capable of reducing and/or minimizing a leakage current generated from a QB node of a GIP during a touch driving period, and to provide a display device including the gate driving circuit.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, and according to an embodiment of the present disclosure, a gate driving circuit comprises a plurality of stages sequentially connected to one another, wherein each of the plurality of stages includes an output unit for outputting a first clock signal as a gate output voltage in response to a voltage of a Q node and a voltage of a QB node; a first node controller configured to charge the voltage of the Q node in response to the gate output voltage from a previous stage; a second node controller configured to charge the voltage of the QB node in response to a second clock signal having a different phase from the first clock signal; a first node stabilizer configured to block a leakage current path of the Q node when the second clock signal is not applied; and a second node stabilizer configured to block a leakage current path of the QB node when the second clock signal is not applied.

According to another embodiment of the present disclosure, a display device comprises a display panel including a plurality of pixels and a plurality of pattern electrodes each corresponding to a group of the plurality of pixels; a gate driving circuit including a plurality of stages and configured to apply a gate output voltage sequentially output from the plurality of stages to the plurality of pixels; a touch driving circuit configured to apply a common voltage to the pattern electrodes during a display driving period, and to apply a touch scan signal to the pattern electrodes during a touch driving period; and a timing controller configured to control the gate driving circuit and the touch driving circuit, wherein, in response to a control signal from the timing controller, the gate driving circuit cuts off a supply of a power supply voltage to a corresponding stage that enters the touch driving period.

The effects according to the present disclosure are not limited by the contents exemplified above, and more various effects are included in the specification.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
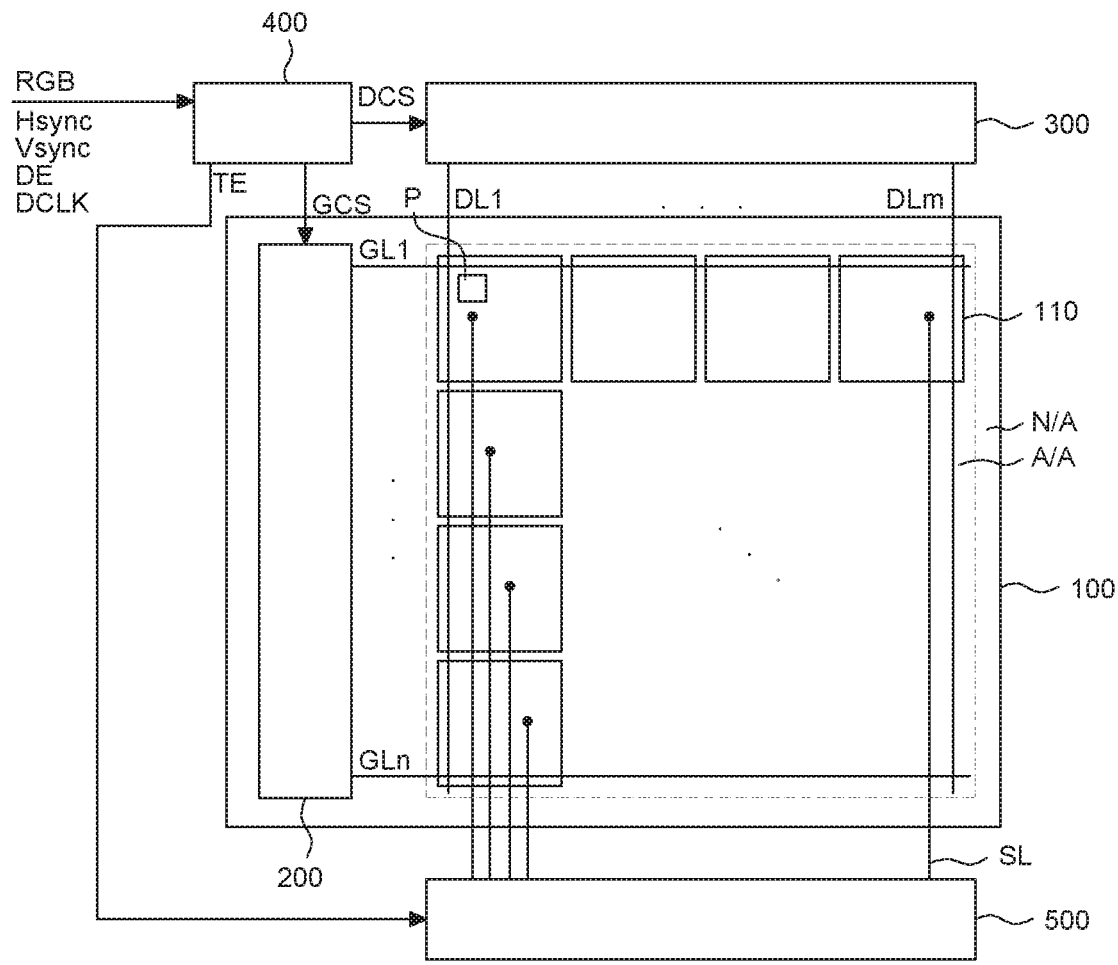
FIG. 1 is a block diagram provided to explain a display device according to an example embodiment of the present disclosure.

Reference will now be made in detail to example embodiments of the present disclosure, examples of which are illustrated in the accompanying drawings.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on." "above," "below," and "next," one or more parts may be positioned between the two parts unless the terms are used with the term "immediately" or "directly." It is to be understood that an element or layer is referred to as being "on" another element or layer, including either intervening layers or other elements directly on or in between. When an element is described as being "connected," "coupled," or "connected" to another element, the element may be directly connected or connected to the other element. However, it should be understood that other elements may be "interposed" between each element, or each element may be "connected," "coupled," or "connected" through another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

The sizes and thicknesses of the individual components shown in the drawings are shown merely for convenience of explanation and the present disclosure is not necessarily limited to the size and thickness of the components shown in the drawings.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

The example embodiments of the present disclosure will be described based on a liquid crystal display device. However, the present disclosure is not limited to the liquid crystal display device and can be applied to all kinds of display devices, such as an organic light emitting display device, including a gate driving circuit.

The example embodiments of the present disclosure may relate to a touch screen-integrated display device. In the touch screen-integrated display device, when a plurality of touch electrodes is formed in an active area of a panel, the touch electrodes may be formed to overlap with a plurality of pixel electrodes. The touch electrodes may operate as common electrodes to drive liquid crystals together with the pixel electrodes in respective pixels during a display driving period, and operate as touch electrodes to sense a touch position using a touch scan signal applied from a touch driving circuit during a touch driving period. That is, display driving and touch driving of the integrated touch screen are performed in a time-division manner.

If the display driving and the touch driving are performed in a time-division manner, a Q node and a QB node of a stage included in a shift register of a GIP are supplied with voltages according to a clock cycle during a display driving period. However, during a touch driving period, a clock (CLK) operation is stopped. Therefore, the Q node and the QB node are maintained in a floating state.

However, during the touch driving period, it may be difficult for the Q node and the QB node of the stage to be stably maintained in a floating state due to environmental influences, such as temperature. Therefore, leakage currents may be generated from the Q node and the QB node, which may cause a voltage drop (e.g., discharge).

This problem may cause the output of an abnormal signal to a gate line, and thus result in poor image quality such as a Dim phenomenon, in which a horizontal line appears on a display panel corresponding to the gate line.

To solve the above-described problem, in the example embodiments of the present disclosure, a gate driving circuit including a Q node stabilizer and a QB node stabilizer, and a display device including the gate driving circuit will be described.

Hereinafter, the present disclosure will be described with reference to the accompanying drawings.

FIG. 1 is a block diagram provided to explain a display device according to an example embodiment of the present disclosure.

With reference to FIG. 1, the display device according to an example embodiment of the present disclosure includes a display panel 100, a gate driving circuit 200, a data driving circuit 300, a timing controller 400, and a touch driving circuit 500.

A touch screen is embedded in the display panel 100, and the touch screen functions to sense a user's touch position. In the display panel 100 according to an example embodiment of the present disclosure, an in-cell type touch screen using self-capacitance may be embedded.

In the display panel 100, all of pixels P are grouped into a plurality of pixel groups, and a plurality of pattern electrodes 110 corresponding to the respective groups may be further included. The plurality of pattern electrodes 110 may be connected to the touch driving circuit 500 through sensing lines SL.

The pattern electrodes 110 may be supplied with a common voltage to perform display driving of the display panel 100. Therefore, the pattern electrodes 110 may operate as common electrodes to drive liquid crystals together with pixel electrodes. Further, the pattern electrodes 110 may be supplied with a touch scan signal to sense a touch. Therefore, the pattern electrodes 110 may operate as touch electrodes to sense a touch position. For example, the display device according to an example embodiment of the present disclosure is a touch screen-integrated display device, where display driving and touch driving are performed in a time-division manner in one frame. Therefore, when the display panel 100 operates in a display driving mode, the plurality of pattern electrodes 110 is supplied with a common voltage and operates as common electrodes to perform display driving together with the pixel electrodes. When the display panel 100 operates in a touch driving mode, the plurality of pattern electrodes 110 is supplied with a touch scan signal from the touch driving circuit 500 and operates as touch electrodes to sense a touch position. Herein, the common voltage may be supplied from the touch driving circuit 500 or directly supplied from a separate common voltage generation unit to the display panel 100 without passing through the touch driving circuit 500. The pattern electrodes 110 are grouped and sequentially operated by group during one frame. The number of pattern electrodes 110 in a group may vary in consideration of a touch driving period and a display driving period.

The display panel 100 includes an active area A/A that displays an image and a non-active area N/A outside the active area A/A. In the non-active area N/A, various signal lines or driving circuits are disposed.

In the active area A/A, a plurality of pixels P is disposed, and an image is displayed based on gray scales displayed by the respective pixels P. In the active area A/A, n number of gate lines GL1, . . . GLn are aligned in a first direction and m number of data lines DL1, . . . DLm are aligned in a direction different from the first direction. The plurality of pixels P is electrically connected to the n number of gate lines GL1, . . . GLn and the m number of data lines DL1, . . . DLm, and displays an image using a driving signal or driving voltage supplied through the gate lines GL1, . . . GLn and the data lines DL1, . . . DLm.

Various signal lines are disposed in the non-active area N/A for transferring a signal to control operating of the pixels P in the active area A/A, as well as, for example, the gate driving circuit 200.

The timing controller 400 transmits an input image signal RGB received from a host system to the data driving circuit 300. The timing controller 400 generates a timing control signal for controlling operation timing of the gate driving circuit 200 and the data driving circuit 300 using timing signals such as a clock signal (DCLK), a horizontal synchronization signal (Hsync), a vertical synchronization signal (Vsync), and a data enable signal (DE) received together with the RGB. Herein, the Hsync is a signal indicating the time taken to display one horizontal line of an image, the Vsync is a signal indicating the time taken to display an image corresponding to one frame, and the DE is a signal indicating a period in which a data voltage is supplied to the pixels P defined in the display panel 100. The timing controller 400 generates a control signal GCS of the gate driving circuit 200 and a control signal DCS of the data driving circuit 300 in synchronization with the timing signals.

The timing controller 400 generates a touch enable signal (TE) for touch driving. The TE is transmitted to the touch driving circuit 500 and the gate driving circuit 200.

The timing controller 400 transmits a plurality of clock signals for determining driving timing of each stage of the gate driving circuit 200 and a voltage control signal to the gate driving circuit 200. Herein, the voltage control signal may be a signal for controlling a QB node stabilizer, which stabilizes a QB node in each stage of the gate driving circuit 200 when the TE for touch driving is generated from the timing controller 400. The QB node stabilizer and the voltage control signal will be described in more detail with reference to FIGS. 3 and 4.

The touch driving circuit 500 may generate a touch scan signal in response to the TE transmitted from the timing controller 400 and apply the common voltage or the touch scan signal to a plurality of electrodes. The touch driving circuit 500 may sense a touch using a difference between touch sensing signals transmitted from the pattern electrodes 110.

The data driving circuit 300 generates a sampling signal using the DCS transmitted from the timing controller 400 and latches image data input from the timing controller 400 into a data signal according to the sampling signal, and then supplies the data signal to the data lines DL1, . . . DLm in response to a source output enable signal (SOE). The data driving circuit 300 may be connected to a bonding pad of the display panel 100 by a chip-on-glass (COG) method, or may be directly disposed on the display panel 100. In some cases, the data driving circuit 300 may be integrated with the display panel 100. Otherwise, the data driving circuit 300 may be disposed by a chip-on-film (COF) method.

The gate driving circuit 200 sequentially supplies gate signals to the gate lines GL1, . . . GLn in response to the GCS transmitted from the timing controller 400. The gate driving circuit 200 may include a shift register and a level shifter.

A gate driving circuit may be configured independently of a display panel, and may be electrically connected to the display panel in various manners. However, the gate driving circuit 200 according to an example embodiment of the present disclosure may be embedded in the display panel 100 in the form of a thin film pattern on the non-active area N/A by a gate-in-panel (GIP) method during manufacture of a substrate of the display panel 100. FIG. 1 illustrates that only one gate driving circuit 200 is provided in the non-active area N/A of the display panel 100, but the present disclosure is not limited thereto, and two or more gate driving circuits 200 may be provided.

The gate driving circuit 200 includes a plurality of stages including a shift register. Hereinafter, the detailed configuration of the gate driving circuit according to an example embodiment of the present disclosure will be described with reference to FIG. 2.

Figure 2:
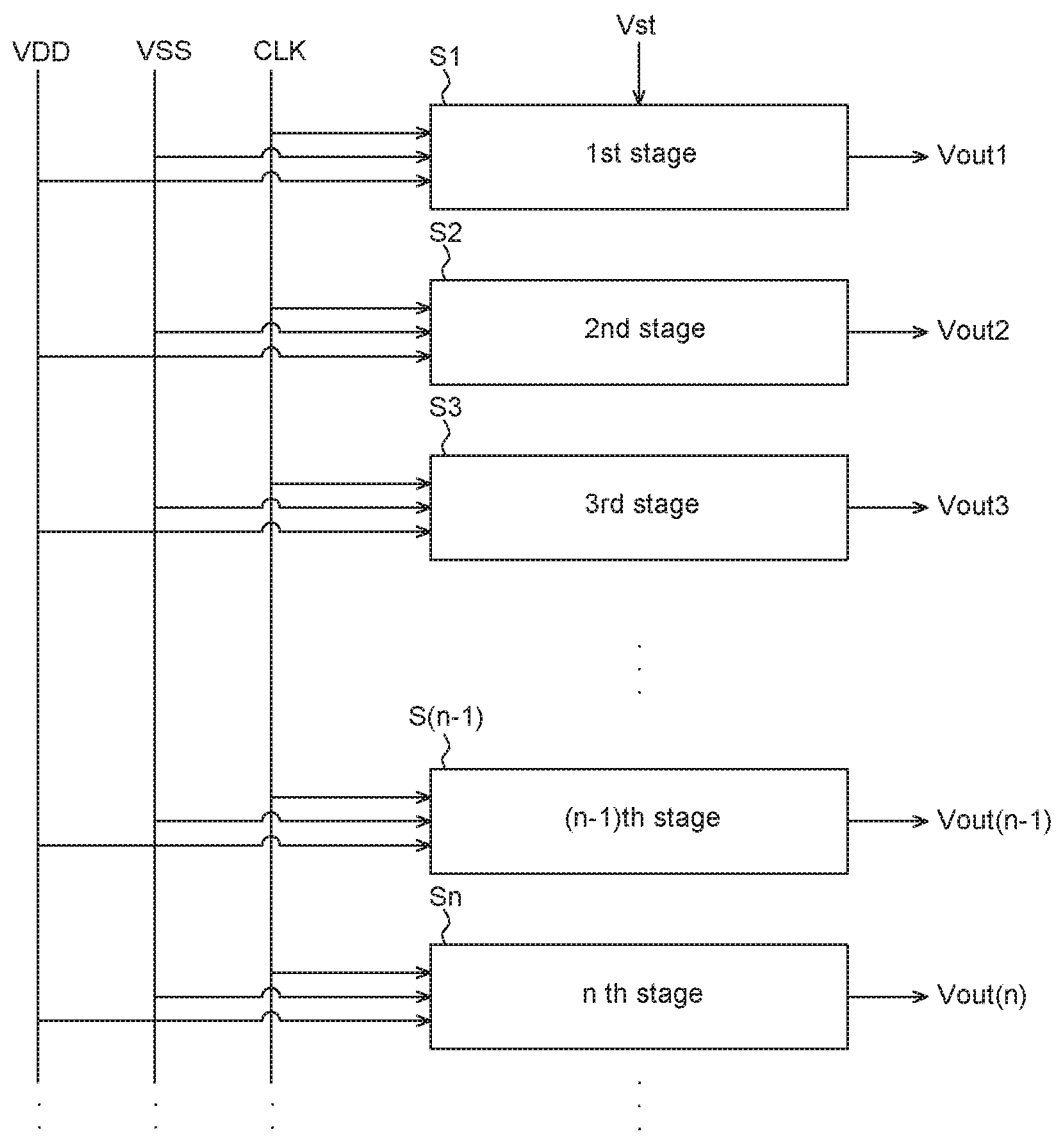
FIG. 2 is a block diagram provided to explain a configuration of a gate driving circuit according to an example embodiment of the present disclosure.

FIG. 2 is a block diagram provided to explain a configuration of a gate driving circuit according to an example embodiment of the present disclosure.

With reference to FIG. 2, the gate driving circuit 200 according to an example embodiment of the present disclosure may include a shift register including first to nth stages S1, S2, S3, . . . S(n−1), Sn configured to receive a power supply voltage (VDD) and a ground voltage (VSS), and to output gate output voltages Vout1, Vout2, Vout3, . . . Vout(n−1), Vout(n) to the gate lines GL1, . . . GLn in response to a clock signal (CLK). Herein, the CLK may include a first CLK CLK(n) and a second CLK CLK(n+2) having two pulses of different phases. For example, the first CLK CLK(n) may be a clock signal for outputting gate output voltages Vout1, Vout2, Vout3, . . . Vout(n−1), Vout(n) to the gate lines, and the second CLK CLK(n+2) may be a clock signal for supplying a voltage to the QB node. That is, a QB voltage may be supplied according to a cycle of the second CLK CLK(n+2).

A first stage S1 is supplied with a gate start signal (VST) and outputs a first gate output voltage Vout1 using a CLK, and a second stage S2 to an nth stage Sn sequentially output second to nth gate output voltages Vout2 to Vout(n) using a plurality of CLKs according to an output voltage of a previous stage or an output voltage of a next stage.

Figure 3:
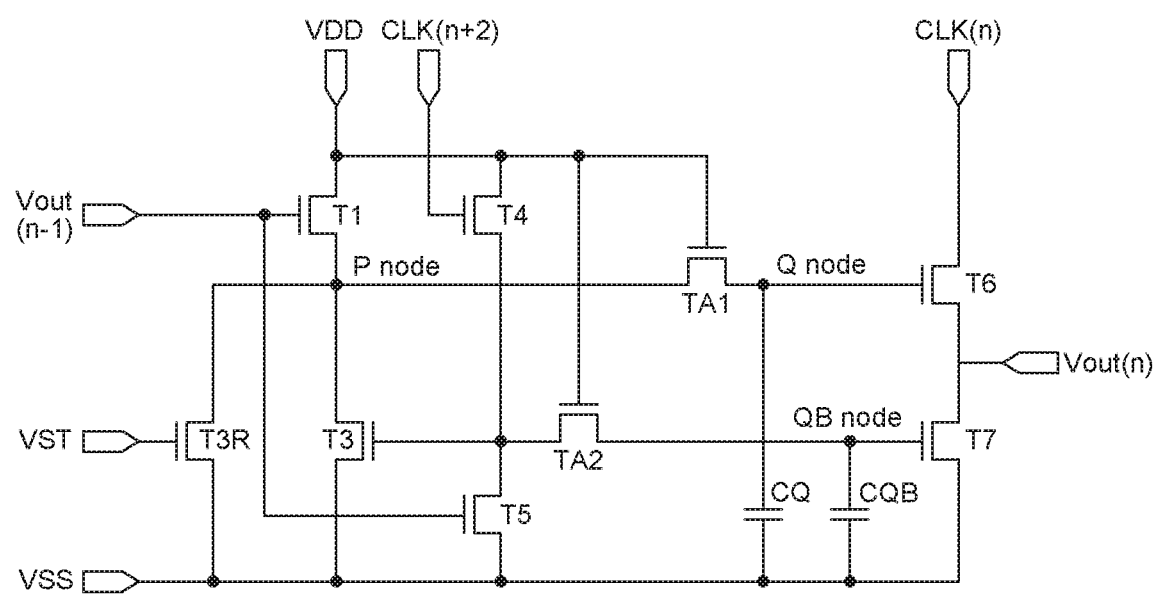
FIG. 3 illustrates an equivalent circuit of each stage included in a gate driving circuit of a display device according to an example embodiment of the present disclosure.

FIG. 3 illustrates an equivalent circuit of each stage included in a gate driving circuit of a display device according to an example embodiment of the present disclosure.

Hereinafter, an operation of outputting gate output voltages Vout1, Vout2, Vout3, . . . Vout(n−1), Vout(n) by the respective stages S1, S2, S3, . . . S(n−1), Sn will be described based on the nth stage Sn. Herein, switch elements constituting the gate driving circuit may be implemented as transistors of n-type or p-type metal oxide semiconductor field effect transistor (MOSFET) structure, as an example. In the example embodiments, an n-type transistor is illustrated, but the present disclosure is not limited thereto. A transistor may be a three-electrode element including a gate, a source, and a drain. The source is an electrode for supplying carriers to the transistor. The carriers inside the transistor may begin to flow from the source. The drain is an electrode through which the carriers exit the transistor to the outside. That is, carriers in the MOSFET flow from the source to the drain. In an n-type MOSFET (NMOS), carriers are electrons, and, thus, a source voltage is lower than a drain voltage so that electrons can flow from a source to a drain. Because the electrons flow from the source to the drain in the NMOS, a current flows from the drain to the source. In a p-type MOSFET (PMOS), carriers are holes, and, thus, a source voltage is higher than a drain voltage so that holes can flow from a source to a drain. Because the holes flow from the source to the drain in the PMOS, a current flows from the source to the drain. It is to be noted that the source and the drain of the MOSFET are not fixed. For example, the source and the drain of the MOSFET may be changed depending on an applied voltage. The present disclosure is not limited to the source and the drain configuration of the transistor as described in the example embodiments.

With reference to FIG. 3, the nth stage of the gate driving circuit may include a first node controller T1, T3R, and T3, a second node controller T4 and T5, a first node stabilizer TA1, a second node stabilizer TA2, a first capacitor CQ, a second capacitor CQB, and an output unit T6 and T7.

The first capacitor CQ may be connected to a Q node, and the second capacitor CQB may be connected to a QB node and VSS.

The first node controller T1, T3R, and T3 determines charge timing of the Q node. The first node controller T1, T3R, and T3 includes the first transistor T1, the second transistor T3R, and the third transistor T3.

In the first transistor T1, a gate electrode is connected to an output terminal Vout(n−1) of an n−1th stage, a first electrode is connected to a power supply voltage (VDD) terminal which is a high-potential voltage source, and a second electrode is connected to the Q node. The first transistor T1 charges the Q node in response to a gate output voltage Vout(n−1) from the n−1th stage.

In the second transistor T3R, a gate electrode is connected to a gate start pulse terminal VST, a first electrode is connected to VSS which is a low-potential voltage source, and a second electrode is connected to the Q node. The second transistor T3R discharges the Q node to VSS in response to a gate start pulse signal supplied through a gate start pulse terminal VST.

In the third transistor T3, a gate electrode is connected to the QB node, a first electrode is connected to VSS, and a second electrode is connected to the Q node. The third transistor T3 discharges the Q node to VSS when the QB node is at a high level.

The second node controller T4 and T5 determines charge timing of the QB node. The second node controller T4 and T5 includes a fourth transistor T4 and a fifth transistor T5.

In the fourth transistor T4, a gate electrode is connected to a second CLK terminal CLK(n+2), a first electrode is connected to VDD, and a second electrode is connected to the QB node. When the VDD of a high level is input, the fourth transistor T4 supplies a QB voltage to charge the QB node according to a cycle of the second CLK CLK(n+2).

In the fifth transistor T5, a gate electrode is connected to the output terminal Vout(n−1) of the n−1th stage, a first electrode is connected to VSS, and a second electrode is connected to the QB node. The fifth transistor T5 discharges the QB node to VSS in response to the output of the n−1th stage.

The first node stabilizer protects transistors, for example, the first node controller including the first transistor T1, the second transistor T3R, and the third transistor T3, connected to a P node, and stabilizes the Q node during a touch driving period to reduce and/or minimize the generation of a leakage current from the Q node. In this case, the touch driving period may refer to a period in which the gate driving circuit does not operate. The first node stabilizer TA1 may include a first auxiliary transistor TA1. In the first auxiliary transistor TA1, a gate is connected to VDD, a first electrode is connected to the P node, and a second electrode is connected to the Q node.

A first auxiliary transistor is typically supplied with the same voltage, that is, VDD, except when a gate voltage is output. However, the first auxiliary transistor is turned off when the Q node is bootstrapped and functions only to protect the transistors T1, T3R, and T3 of the first node controller connected to the P node. However, the first auxiliary transistor TA1 of the gate driving circuit according to an example embodiment of the present disclosure is turned off in response to a voltage control signal that controls a level of VDD when the TE is input from the timing controller 400, and functions to suppress the generation of a leakage current from the Q node.

The second stabilizer TA2 is turned off when VDD has a low level in response to a voltage control signal during the touch driving period. Therefore, the second stabilizer TA2 increases an off-current path of a QB voltage and thus enables the QB node to be stably maintained in a floating stage during the touch driving period. The second stabilizer TA2 may include a second auxiliary transistor TA2. In the second auxiliary transistor TA2, a gate is connected to the VDD, and, thus, VDD is not applied during a touch mode in response to a voltage control signal. Therefore, the second auxiliary transistor TA2 may increase an off-current path of a QB voltage and thus reduce and/or minimize discharging of the QB node.

The output unit T6 and T7 includes a sixth transistor T6 configured to pull up an nth gate output voltage Vout(n) and a seventh transistor T7 configured to pull down the nth gate output voltage Vout(n).

In the sixth transistor T6, a gate is connected to the Q node, a first electrode is connected to the first CLK CLK(n), and a second electrode is connected to an output terminal Vout(n) of the nth stage. The sixth transistor T6 outputs the first CLK CLK(n) to the output terminal Vout(n) of the nth stage when the Q node is in a charged state.

In the seventh transistor T7, a gate is connected to the QB node, a first electrode is connected to the output terminal Vout(n) of the nth stage, and a second electrode is connected to VSS. The seventh transistor T7 discharges a potential of the output terminal Vout(n) of the nth stage to VSS when the QB node is in a charged state.

The nth stage of the gate driving circuit according to an example embodiment of the present disclosure is driven as follows. During a first time section in a display driving period of the nth stage, the first transistor T1 may be turned on by an output signal of the n–1th stage to supply forward power to the Q node, the fifth transistor T5 may be turned on by a voltage charged in the Q node to discharge the QB node, and the sixth transistor T6 may be turned on by bootstrapping with a high logic level of the first CLK CLK(n) to output a scan pulse of a high logic level to the output terminal Vout(n) of the nth stage. Meanwhile, when the Q node is bootstrapped, the first auxiliary transistor TA1 may be turned off to protect the first transistor T1, the second transistor T3R, and the third transistor T3 included in the first node controller and maintain the Q node with little change. Therefore, because the gate driving circuit according to an example embodiment of the present disclosure includes the first auxiliary transistor TA1, stabilization of the Q node may be promoted.

Meanwhile, during a second time section following the first time section in the display driving period of the nth stage, the first transistor T1 may be turned on by an output signal of the n–1th stage to supply reverse power to the Q node, and, thus, the Q node may be discharged, and the fourth transistor T4 turned on by forward power may charge the QB node according to a cycle of the second CLK CLK(n+2) to turn on the seventh transistor T7 and discharge the output terminal Vout(n) of the nth stage by VSS.

Meanwhile, if the nth stage of the gate driving circuit according to an example embodiment of the present disclosure operates in a touch driving period, when a voltage control signal generated by the timing controller 400 is input, VDD is not supplied to the nth stage, but is turned off. As such, if VDD is turned off, the first auxiliary transistor TA1 is turned off, and, thus, a leakage current path of the Q node is blocked to stably maintain a Q node voltage. Further, if VDD is turned off, the second auxiliary transistor TA2 is turned off and the second CLK CLK(n+2)) is not supplied, and, thus, the fourth transistor T4 is also turned off to maintain a QB voltage charged in the QB node in a floating state. Therefore, the gate driving circuit according to an example embodiment of the present disclosure may stably maintain a QB node voltage by blocking a leakage current path of the QB node.

Figure 4A:
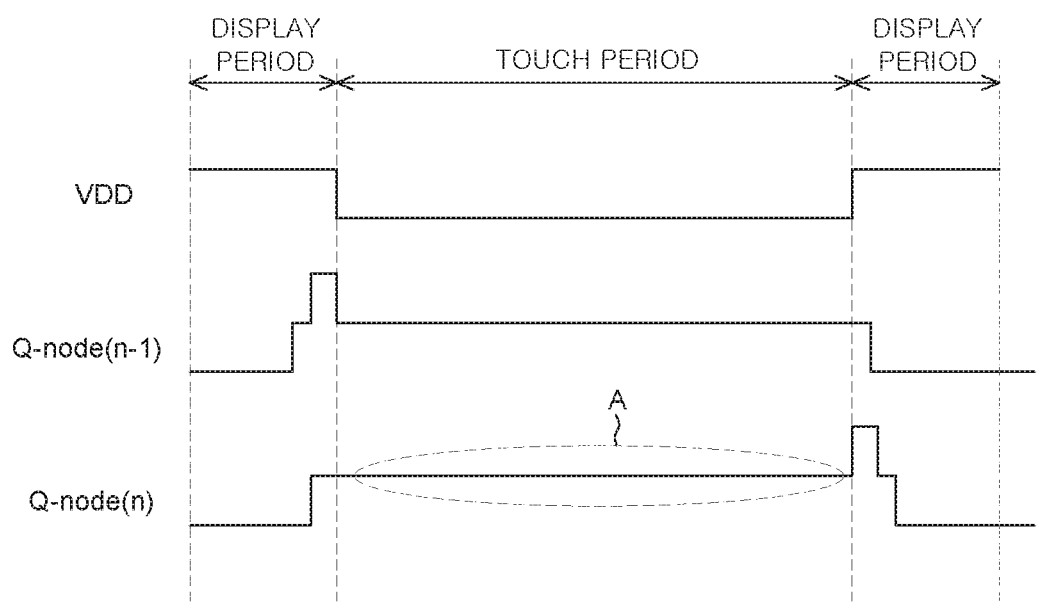
FIGS. 4A and 4B are timing charts showing internal signals of each stage included in a gate driving circuit of a display device according to an example embodiment of the present disclosure.
Figure 4B:
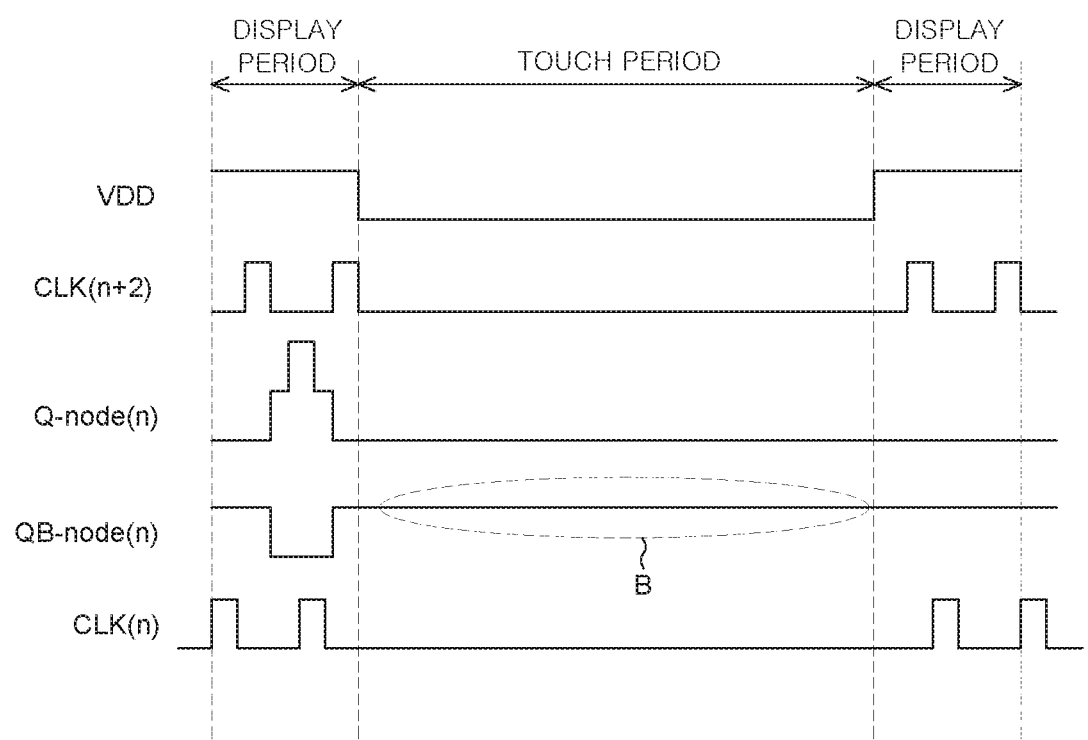

FIGS. 4A and 4B are timing charts showing internal signals of each stage included in a gate driving circuit of a display device according to an example embodiment of the present disclosure.

As illustrated in FIGS. 4A and 4B, each stage of a gate driving circuit 200 of a display device according to an example embodiment of the present disclosure may be time-division driven in a display driving period and a touch driving period.

FIG. 4A shows an operation timing chart of a Q node. During a display driving period ("DISPLAY PERIOD"), if a VDD of a high level is applied and an (n–2)th gate output voltage is output, a first transistor of an (n–1)th stage charges the Q node to a high-potential power supply voltage. Then, if a bootstrap circuit is formed by a gate-source capacitor of the turned-on first transistor, a voltage of an (n–1)th Q node is bootstrapped and increased. Thus, a gate output voltage is output from an output terminal of the (n–1)th stage. In this case, a first transistor T1 of an nth stage is turned on to charge the Q node(n) to a high-potential power supply voltage.

Then, when a TE is generated by the timing controller 400 and then applied to the gate driving circuit 200, a touch driving period starts and a first auxiliary transistor TA1 is turned off in response to a voltage control signal generated when the TE is generated, and thus, VDD is not supplied to the nth stage in the touch driving period. Therefore, it may be possible to completely block a leakage current which may be generated from a Q node(n) due to the surrounding environment. Accordingly, discharging as indicated by A in FIG. 4A may not occur, and a charging voltage state can be stably maintained.

Then, when a display driving period starts after the touch driving period is ended, the VDD of a high level is supplied in response to a voltage control signal transmitted from the timing controller 400. An nth Q node of the nth stage is stably maintained in a charging voltage state during the touch driving period, and thus, a voltage of the nth Q node is bootstrapped and increased. Therefore, a gate output voltage may be output from an output terminal of the nth stage.

FIG. 4B shows an operation timing chart of a QB node. During a display driving period, a VDD of high level is applied and a second CLK CLK(n+2) is regularly applied. In this case, if the second CLK CLK(n+2) is shifted from a high level to a low level, the first transistor T1 charges the Q node to a high-potential power supply voltage in response to a gate output voltage Vout(n–1) from the (n–1)th stage, and a fourth transistor T4 charges the QB node to a low-potential power supply voltage according to a cycle of the second CLK CLK(n+2).

Then, if a bootstrap circuit is formed by a gate-source capacitor of the first transistor T1 which is turned on during a period in which the second CLK CLK(n+2) is not applied, a voltage of the Q node is bootstrapped and increased. If the voltage of the Q node is increased as such, a first CLK CLK(n) may be output as a gate output voltage of the nth stage from the output terminal of the nth stage.

Then, if the second CLK CLK(n+2) is shifted to a high level, the fourth transistor T4 charges the QB node to the VDD and a voltage of the Q node is discharged to VSS by a second transistor T3R and a third transistor T3.

Then, when the TE is generated by the timing controller 400 and then applied to the gate driving circuit 200, a touch driving period starts and the VDD is not supplied to the nth stage Sn in the touch driving period in response to a voltage control signal generated when the TE is generated. Thus, the first auxiliary transistor TA1 and a second auxiliary transistor TA2 are turned off to completely block leakage current paths which may be generated from the Q node and the QB node due to the surrounding environment. Accordingly, discharging as indicated by B in FIG. 4B may not occur, and a charging voltage state can be stably maintained.

Figure 5:
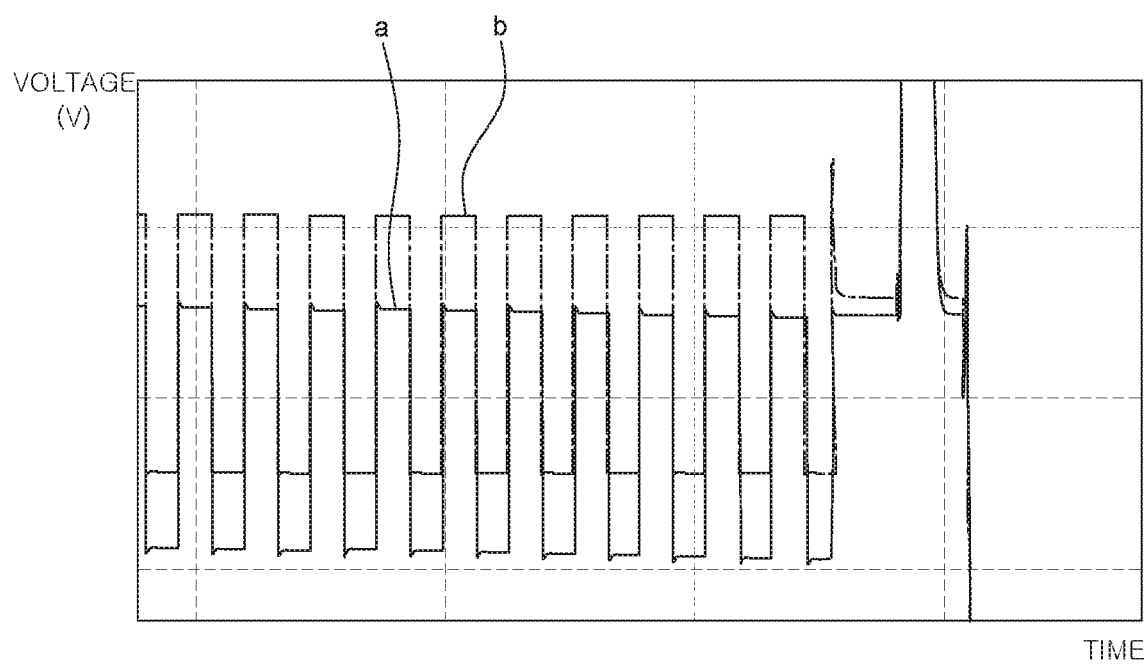
FIG. 5 is a diagram provided to explain the effectiveness of a gate driving circuit of a display device according to an example embodiment of the present disclosure.

FIG. 5 is a diagram provided to explain the effect of a gate driving circuit of a display device according to an example embodiment of the present disclosure.

With reference to FIG. 5, it can be seen that if the first stabilizer TA1 and the second stabilizer TA2 of the present disclosure are not provided as indicated by a in FIG. 5, discharging occurs at the Q node or the QB node.

Meanwhile, it can be seen that the gate driving circuit according to an example embodiment of the present disclosure includes the first stabilizer TA1 and the second stabilizer TA2 as indicated by b in FIG. 5, and, thus, discharging does not occur at the Q node or the QB node even after time passes, and a stable voltage state may be maintained.

As such, the gate driving circuit and the display device including the gate driving circuit according to an example embodiment of the present disclosure include the first stabilizer TA1 and the second stabilizer TA2 capable of stably maintaining voltages of the Q node and the QB node. Thus, it may be possible to improve the reliability of the display device.

Further, the gate driving circuit according to an example embodiment of the present disclosure includes the first node stabilizer TA1 and the second node stabilizer TA2 that may be capable of completely blocking a leakage current. Thus, the gate driving circuit may be disposed regardless of the surrounding environment, and the degree of freedom of design can be improved.

Some of the example embodiments of the present disclosure can also be described as follows:

According to an aspect of the present disclosure, a gate driving circuit may comprise a plurality of stages dependently connected to one another. Each of the plurality of stages may include an output unit for outputting a first clock signal as a gate output voltage in response to a voltage of a Q node and a voltage of a QB node, a first node controller for charging the voltage of the Q node in response to an output signal from a previous stage, a second node controller for charging the voltage of the QB node in response to a second clock signal having a different phase from the first clock signal, a first node stabilizer for blocking a leakage current path of the Q node if the second clock signal is not applied and a second node stabilizer for blocking a leakage current path of the QB node if the second clock signal is not applied.

A power supply voltage VDD may be not supplied to a corresponding stage when the first clock signal is not applied.

The first node stabilizer may include a first auxiliary transistor, and the first auxiliary transistor may have a gate connected to the power supply voltage.

The second node stabilizer may include a second auxiliary transistor, and the second auxiliary transistor may have a gate connected to the power supply voltage.

A period in which the second clock signal is not applied may be a touch driving period, and a period in which the second clock signal is regularly applied may be a display driving period.

According to an another aspect of the present disclosure, a display device may comprise a display panel including a plurality of pixels and a plurality of pattern electrodes arranged by grouping the plurality of pixels, a gate driving circuit which is composed of a plurality of stages and applies a gate output voltage sequentially output from the plurality of stages to the plurality of pixels, a touch driving circuit for applying a common voltage when the display panel is in a display driving period and applying a touch scan signal when the display panel is in a touch driving period, and a timing controller for controlling the gate driving circuit and the touch driving circuit, wherein the gate driving circuit cuts off the supply of a power supply voltage to a corresponding stage that enters a touch driving period in response to a control signal transmitted from the timing controller.

The timing controller may transmit a touch enable signal and a voltage control signal for controlling the power supply voltage to the stage of the gate driving circuit that has entered the touch driving period.

Each of the plurality of stages may include a Q node stabilizer and a QB node stabilizer for stably maintaining a voltage of a Q node and a voltage of a QB node during the touch driving period.

The Q node stabilizer may include a first auxiliary transistor in which a gate is connected to the power supply voltage.

The Q node stabilizer may be turned off when the Q node is bootstrapped.

The QB node stabilizer may include a second auxiliary transistor in which a gate is connected to the power supply voltage.

Although the aspects of the present disclosure have been described in detail with reference to the accompanying drawings, it is to be understood that the present disclosure is not limited to those described aspects and various changes and modifications may be made without departing from the scope of the present disclosure. Therefore, the aspects disclosed in the present disclosure are not intended to limit the technical scope of the present disclosure, but to illustrate them. Thus, the technical scope of the present disclosure is not limited by these aspects. It should be understood that the above-described aspects are merely illustrative in all aspects and not restrictive. The scope of the present disclosure should be construed only by the appended claims, and all technical features within the scope of equivalents should be construed as being included in the scope of the present disclosure.

It will be apparent to those skilled in the art that various modifications and variations can be made in the gate driving circuit and display device comprising the same of the present disclosure without departing from the spirit or scope of the disclosure. Thus, it is intended that the present disclosure cover the modifications and variations of this disclosure provided they come within the scope of the appended claims and their equivalents.

What is claimed is:

1. A gate driving circuit, comprising:
 a plurality of stages sequentially connected to one another, wherein each of the plurality of stages includes:
 an output unit for outputting a first clock signal as a gate output voltage in response to a voltage of a Q node and a voltage of a QB node;

a first node controller configured to charge the voltage of the Q node in response to the gate output voltage from a previous stage;

a second node controller configured to charge the voltage of the QB node in response to a second clock signal having a different phase from the first clock signal;

a first node stabilizer configured to block a leakage current path of the Q node when the second clock signal is not applied and in response to a power supply voltage VDD not being supplied to the first node stabilizer; and a second node stabilizer configured to block a leakage current path of the QB node when the second clock signal is not applied and in response to the power supply voltage VDD not being supplied to the second node stabilizer.

2. The gate driving circuit according to claim 1, wherein when the first clock signal is not applied, the power supply voltage VDD is not supplied to a corresponding stage.

3. The gate driving circuit according to claim 2, wherein:
the first node stabilizer includes a first auxiliary transistor, and
the first auxiliary transistor has a gate connected to the power supply voltage.

4. The gate driving circuit according to claim 2, wherein:
the second node stabilizer includes a second auxiliary transistor, and
the second auxiliary transistor has a gate connected to the power supply voltage.

5. The gate driving circuit according to claim 1, wherein:
a period in which the second clock signal is not applied corresponds to a touch driving period, and a period in which the second clock signal is regularly applied corresponds to a display driving period.

6. A display device, comprising:
a display panel including a plurality of pixels and a plurality of pattern electrodes each corresponding to a group of the plurality of pixels;

a gate driving circuit including a plurality of stages and configured to apply a gate output voltage sequentially output from the plurality of stages to the plurality of pixels;

a touch driving circuit configured to apply a common voltage to the pattern electrodes during a display driving period, and to apply a touch scan signal to the pattern electrodes during a touch driving period; and a timing controller configured to control the gate driving circuit and the touch driving circuit, wherein, in response to a control signal from the timing controller, the gate driving circuit cuts off a supply of a power supply voltage to a corresponding stage that enters the touch driving period, and wherein each of the plurality of stages includes:
an output unit for outputting a first clock signal as a gate output voltage in response to a voltage of a Q node and a voltage of a QB node;

a first node controller configured to charge the voltage of the Q node in response to the gate output voltage from a previous stage;

a second node controller configured to charge the voltage of the QB node in response to a second clock signal having a different phase from the first clock signal;

a Q node stabilizer configured to block a leakage current path of the Q node when the second clock signal is not applied and in response to the power supply voltage not being supplied to the first node stabilizer; and a QB node stabilizer configured to block a leakage current path of the QB node when the second clock signal is not applied and in response to the power supply voltage not being supplied to the second node stabilizer.

7. The display device according to claim 6, wherein the timing controller is further configured to transmit a touch enable signal and a voltage control signal to the gate driving circuit to control the power supply voltage to the stage of the gate driving circuit that has entered the touch driving period.

8. The display device according to claim 7, wherein the Q node stabilizer and the QB node stabilizer stably maintain a voltage of the Q node and a voltage of the QB node during the touch driving period.

9. The display device according to claim 7, wherein the Q node stabilizer includes a first auxiliary transistor having a gate electrode connected to the power supply voltage.

10. The display device according to claim 9, wherein the Q node stabilizer is configured to be turned off when the Q node is bootstrapped.

11. The display device according to claim 7, wherein the QB node stabilizer includes a second auxiliary transistor having a gate electrode connected to the power supply voltage.

* * * * *